US 8,697,513 B2

(12) United States Patent
Tanabe

(10) Patent No.: US 8,697,513 B2
(45) Date of Patent: Apr. 15, 2014

(54) MANUFACTURING METHOD OF SEMICONDUCTOR DEVICE HAVING N-CHANNEL MOS TRANSISTOR, P-CHANNEL MOS TRANSISTOR AND EXPANDING OR CONTRACTING FILM

(71) Applicant: Fujitsu Semiconductor Limited, Yokohama (JP)

(72) Inventor: Ryo Tanabe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/889,635

(22) Filed: May 8, 2013

(65) Prior Publication Data
US 2013/0244435 A1 Sep. 19, 2013

Related U.S. Application Data

(60) Division of application No. 12/568,059, filed on Sep. 28, 2009, now Pat. No. 8,461,652, which is a continuation of application No. PCT/JP2007/056940, filed on Mar. 29, 2007.

(51) Int. Cl.
*H01L 21/8238* (2006.01)
(52) U.S. Cl.
USPC .......... 438/199; 438/275; 438/528; 438/783; 257/369; 257/401
(58) Field of Classification Search
None
See application file for complete search history.

(56) References Cited

U.S. PATENT DOCUMENTS 7,183,613 B1 2/2007 Zhu et al.
2004/0217448 A1 11/2004 Kumagai et al.
2005/0285137 A1* 12/2005 Satoh .................... 257/178
(Continued)

FOREIGN PATENT DOCUMENTS

JP 2004-335741 A 11/2004
JP 2006-080161 A 3/2006
JP 2006-286889 A 10/2006

OTHER PUBLICATIONS

Y. Kumagai, et al.; "Evaluation of Change in Drain Current Due to Strain in 0.13-mm-node MOSFETs" Extended Abstracts of the 2002 International Conference on Solid State Devices and Materials, pp. 14-15, 2002, Nagoya.

(Continued)

*Primary Examiner* — Andres Munoz
(74) *Attorney, Agent, or Firm* — Westerman, Hattori, Daniels & Adrian, LLP

(57) ABSTRACT

In a second direction, in a plan view, an n-channel MOS transistor and an expanding film are adjacent. Therefore, the n-channel MOS transistor receives a positive stress in the direction in which a channel length is extended from the expanding film. As a result, a positive tensile strain in an electron moving direction is generated in a channel of the n-channel MOS transistor. On the other hand, in the second direction, in a plan view, a p-channel MOS transistor and the expanding film are shifted from each other. Therefore, the p-channel MOS transistor receives a positive stress in the direction in which a channel length is narrowed from the expanding film. As a result, a positive compressive strain in a hole moving direction is generated in a channel of the p-channel MOS transistor. Thus, both on-currents of the n-channel MOS transistor and the p-channel MOS transistor can be improved.

4 Claims, 21 Drawing Sheets

(56) References Cited

U.S. PATENT DOCUMENTS

| | | |
|---|---|---|
| 2006/0131662 A1 | 6/2006 | Yamada et al. |
| 2006/0220142 A1 | 10/2006 | Tamura |
| 2007/0015347 A1* | 1/2007 | Mehta et al. .................. 438/514 |
| 2007/0108471 A1 | 5/2007 | Oishi |
| 2007/0132032 A1 | 6/2007 | Teo et al. |
| 2009/0230439 A1 | 9/2009 | Wang et al. |

OTHER PUBLICATIONS

International Search Report for PCT/JP2007/056940, mailing date of Jun. 26, 2007.

Notification of Transmittal Copies of Translation of the International Preliminary Report on Patentability (Form PCT/IB/338) of International Application No. PCT/JP2007/056940 mailed Oct. 29, 2009 with Forms PCT/IB/373, PCT/IB/326 and PCT/ISA/237.

* cited by examiner

MANUFACTURING METHOD OF SEMICONDUCTOR DEVICE HAVING N-CHANNEL MOS TRANSISTOR, P-CHANNEL MOS TRANSISTOR AND EXPANDING OR CONTRACTING FILM

CROSS-REFERENCE TO RELATED APPLICATIONS

This application a divisional of U.S. application Ser. No. 12/568,059, filed Sep. 28, 2009, which is a Continuation of International Application No. PCT/JP2007/056940, with an international filing date of Mar. 29, 2007, which designating the United States of America, the entire contents of which are incorporated herein by reference.

FIELD

The present invention relates to a semiconductor device in which an on-current in a CMOS transistor is improved, and a manufacturing method thereof.

BACKGROUND

Conventionally, a structure in which a strain is generated in a channel in order to improve an on-current in a MOS transistor has been practically applied. For example, an n-channel MOS transistor covered with a film generating a tensile stress has been practically applied. Further, a p-channel MOS transistor having a SiGe layer formed in a source and a drain thereof has also been practically applied.

As described above, it is preferable to generate a strain in a tensile direction (a tensile strain) in a channel in an n-channel MOS transistor, and generate a strain in a compressive direction (a compressive strain) in a channel in a p-channel MOS transistor. Therefore, when manufacturing a semiconductor device having both an n-channel MOS transistor and a p-channel MOS transistor such as a CMOS transistor, in order to generate preferable strains in both of the transistors, it is necessary to perform processing separately. In this case, time and cost are increased significantly.

For example, in an SRAM (static random access memory) cell, as illustrated in FIG. 17, p-channel MOS transistors P1 and P2 having sources thereof connected to a power supply Vdd are provided, and n-channel MOS transistors N1 and N2 having sources thereof grounded are provided. Then, respective drains of the transistors P1 and N1 are connected to each other, and respective drains of the transistors P2 and N2 are connected to each other. That is, in the SRAM cell, two CMOS transistors are included. Further, an n-channel MOS transistor N3 having a gate connected to a word line W is connected between the CMOS transistor composed of the transistors P1 and N1 and a bit line /B, and an re-channel MOS transistor N4 having a gate connected to the word line W is connected between the CMOS transistor composed of the transistors P2 and N2 and a bit line B. Accordingly, the CMOS transistors are included in the SRAM cell.

Then, in a conventional SRAM cell, layouts as illustrated in FIG. 18 or FIG. 19 have been adopted. In either case, gates 105 and p-type impurity diffusion layers 107p are provided in transistors P1 and P2, and the gates 105 and n-type impurity diffusion layers 107n are provided in transistors N1 to N4. Then, the transistor P1 and the transistor N1 are disposed in parallel to each other, and the transistor P2 and the transistor N2 are disposed in parallel to each other. This is to share the gate between the two transistors constituting a CMOS transistor.

Therefore, when compressive strains are made to be generated in the transistors P1 and P2, compressive strains are also generated in the transistors N1 and N2. Then, when tensile strains are made to be generated in the transistors N1 and N2, tensile strains are also generated in the transistors P1 and P2.

Thus, in a conventional technique, it is not possible to improve both on-currents of the two transistors constituting the CMOS transistor. This is also obvious from description of Non-Patent Document 1 or the like.

Patent Document 1: Japanese Patent Application Laid-open No. 2004-335741
Patent Document 2: Japanese Patent Application Laid-open No. 2006-80161
Non-Patent Document 1: SSDM, pp. 14-15, 2002

SUMMARY

According to an aspect of the embodiment, a semiconductor device is provided with a semiconductor substrate, an n-channel MOS transistor formed on the semiconductor substrate, and a p-channel MOS transistor formed on the semiconductor substrate. Further, a stress applying film generating a positive tensile strain in an electron moving direction in a channel of the n-channel MOS transistor and generating a positive compressive strain in a hole moving direction in a channel of the p-channel MOS transistor is provided. As the stress applying film, an expanding film exerting a positive stress outwardly or a contracting film exerting a positive stress inwardly is formed.

According to another aspect of the embodiment, in a manufacturing method of a semiconductor device, on a semiconductor substrate, an n-channel MOS transistor and a p-channel MOS transistor are formed, and a stress applying film generating a positive tensile strain in an electron moving direction in a channel of the n-channel MOS transistor and generating a positive compressive strain in a hole moving direction in a channel of the p-channel MOS transistor is formed. In the forming the stress applying film, the stress applying film is formed on an entire surface, and stresses are left in only portions where the positive tensile strain and the positive compressive strain are generated by performing an ion implantation into the stress applying film selectively.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be explained concretely with reference to the attached drawings.

First Embodiment

Figure 1A:
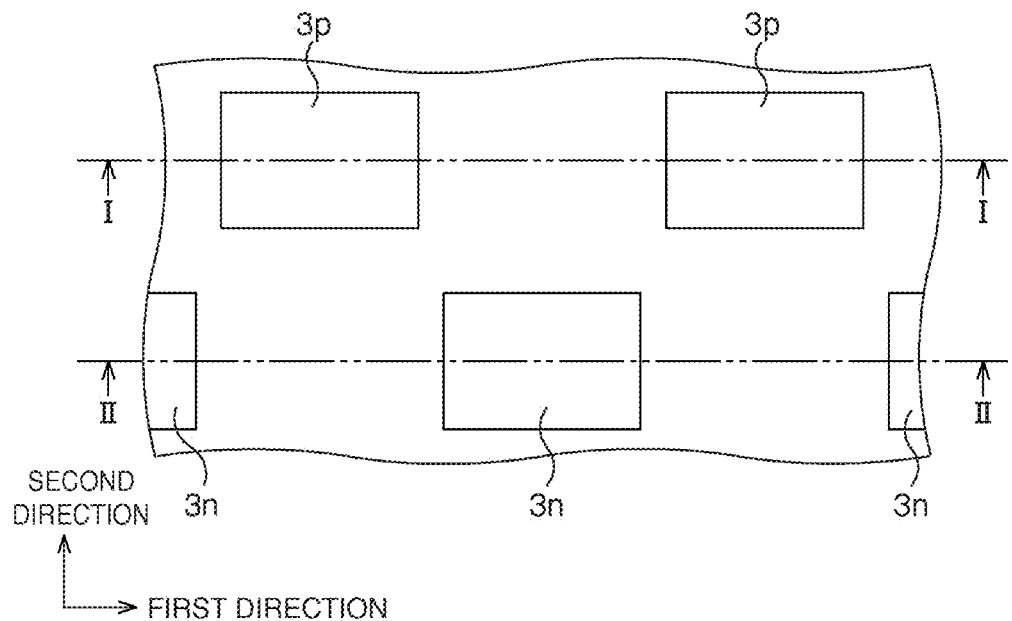
FIG. 1A and FIG. 1B are plan views showing a manufacturing method of a semiconductor device according to a first embodiment in order of steps.
Figure 1B:
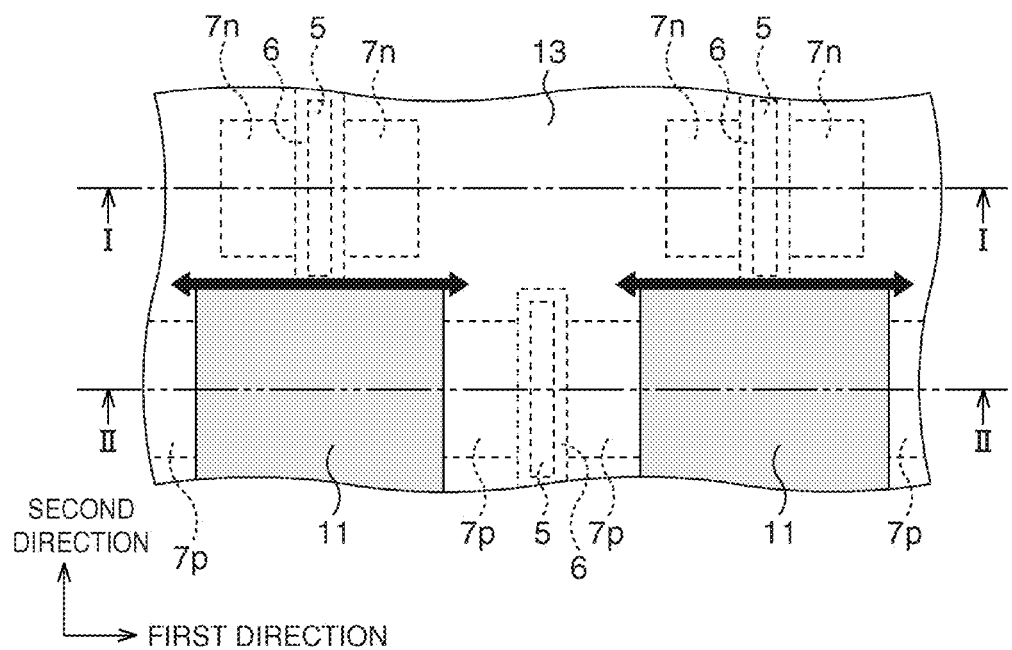

First, a first embodiment will be explained. In the first embodiment, an n-channel MOS transistor and a p-channel MOS transistor having channels extending in parallel to each other are formed on a semiconductor substrate. Further, within a plane parallel to the surface of the semiconductor substrate, a direction in which straight lines connecting sources and drains of these transistors are extended (a channel length direction) is referred as a first direction, and a direction perpendicular to the first direction (a channel width direction) is referred as a second direction. That is, in the n-channel MOS transistor, an electron moving direction in the channel corresponds to the first direction, and in the p-channel MOS transistor, a hole moving direction in the channel corresponds to the first direction. Further, a region where the n-channel MOS transistor is to be formed is referred as an nMOS region, and a region where the p-channel MOS transistor is to be formed is referred as a pMOS region. FIG. 1A and FIG. 1B are plan views showing a manufacturing method of a semiconductor device according to the first embodiment in order of steps. Further, FIG. 2A to FIG. 2E are cross-sectional views showing the manufacturing method of a semiconductor device according to the first embodiment in order of steps, and FIG. 3A to FIG. 3E are also cross-sectional views showing the manufacturing method of a semiconductor device according to the first embodiment in order of steps. Note that FIG. 2A to FIG. 2E show cross sections taken along a line I-I in FIG. 1A and FIG. 1B, and FIG. 3A to FIG. 3E show cross sections taken along a line II-II in FIG. 1A and FIG. 1B.

Figure 2A:
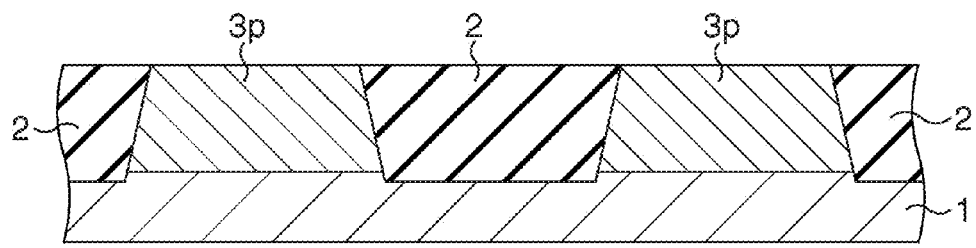
FIG. 2A to FIG. 2E are cross-sectional views showing the manufacturing method of a semiconductor device according to the first embodiment in order of steps.
Figure 3A:
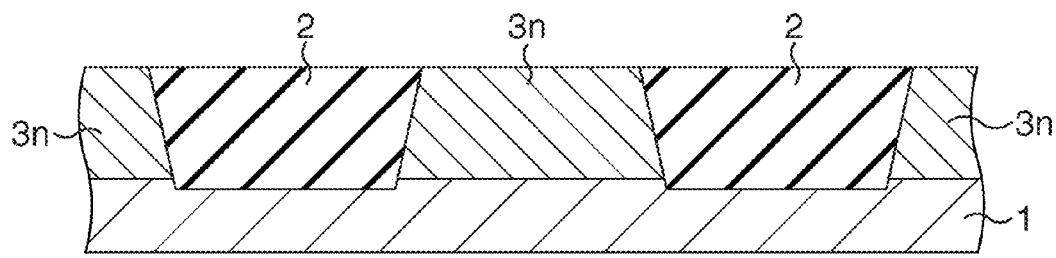
FIG. 3A to FIG. 3E are cross-sectional views showing the manufacturing method of a semiconductor device according to the first embodiment in order of steps.

In the first embodiment, first, as illustrated in FIG. 1A, FIG. 2A, and FIG. 3A, an element isolation insulating film 2 is formed on a surface of a semiconductor substrate 1 such as a silicon substrate by, for example, an STI (shallow trench isolation) method. In this moment, the nMOS regions are arranged in a row in the first direction, and the pMOS regions are arranged in a row in the first direction while separating from the row of the nMOS regions. Further, with regard to the second direction as well, the pMOS regions are shifted from the nMOS regions. Next, by introducing an impurity, a p-well 3p is formed in the nMOS region, and an n-well 3n is formed in the pMOS region.

Figure 2B:
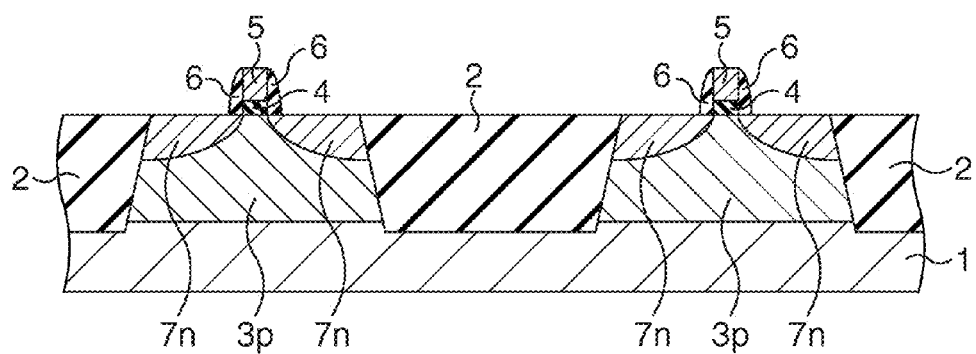
Figure 3B:
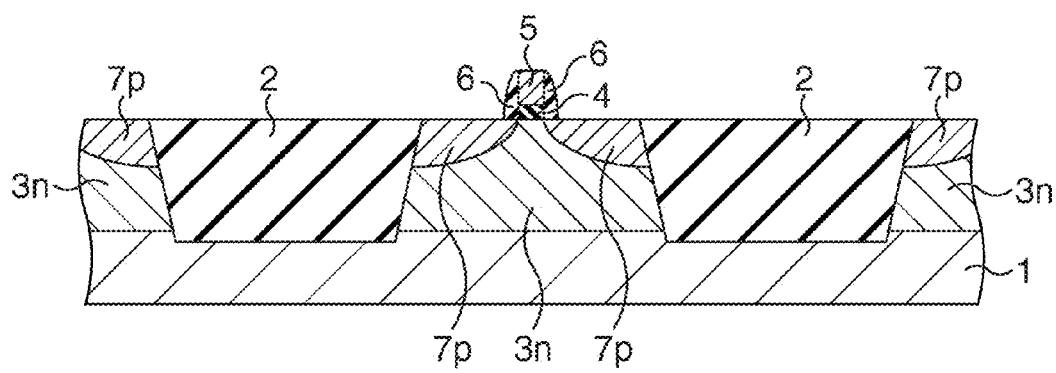

Next, as illustrated in FIG. 2B and FIG. 3B, gate insulating films 4, gate electrodes 5, sidewall insulating films 6, and impurity diffusion layers are formed in the nMOS region and the pMOS region. In the nMOS region, as illustrated in FIG. 2B, n-type impurity diffusion layers 7n are formed as the impurity diffusion layers, and in the pMOS region, as illustrated in FIG. 3B, p-type impurity diffusion layers 7p are formed as the impurity diffusion layers.

Figure 2C:
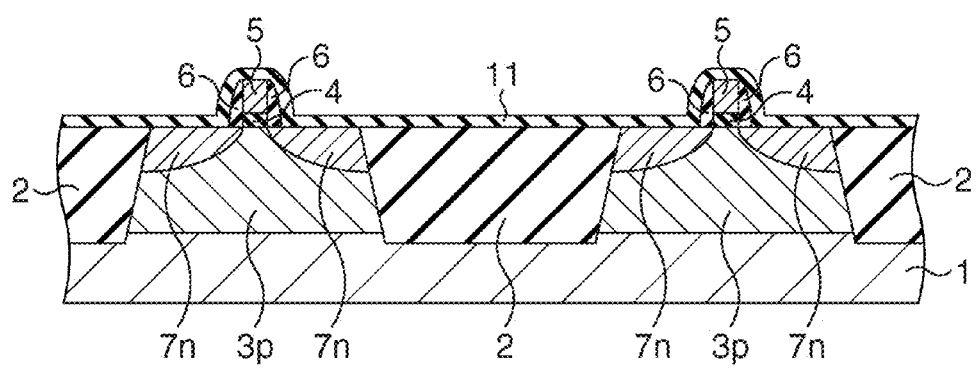
Figure 3C:
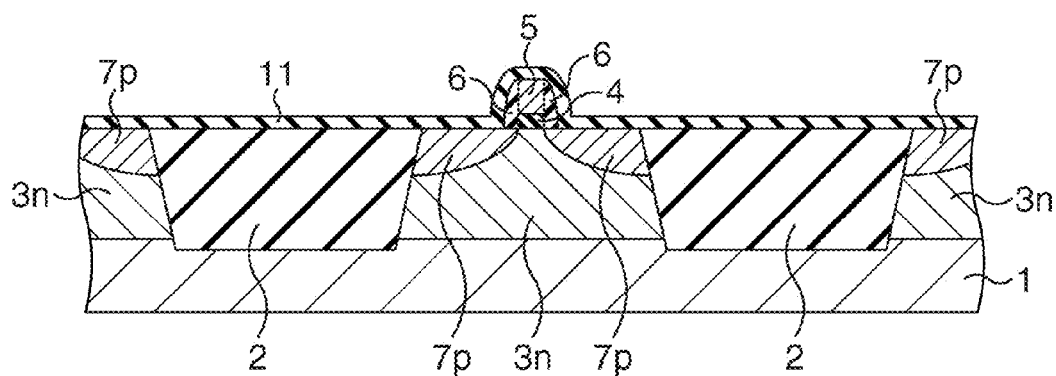

Thereafter, as illustrated in FIG. 2C and FIG. 3C, an insulative expanding film 11 exerting a positive stress facing outwardly on a periphery is formed on the entire surface as a stress applying film. As the expanding film 11, a silicon nitride film formed by, for example, a thermal CVD (chemical vapor deposition) method can be cited.

Figure 2D:
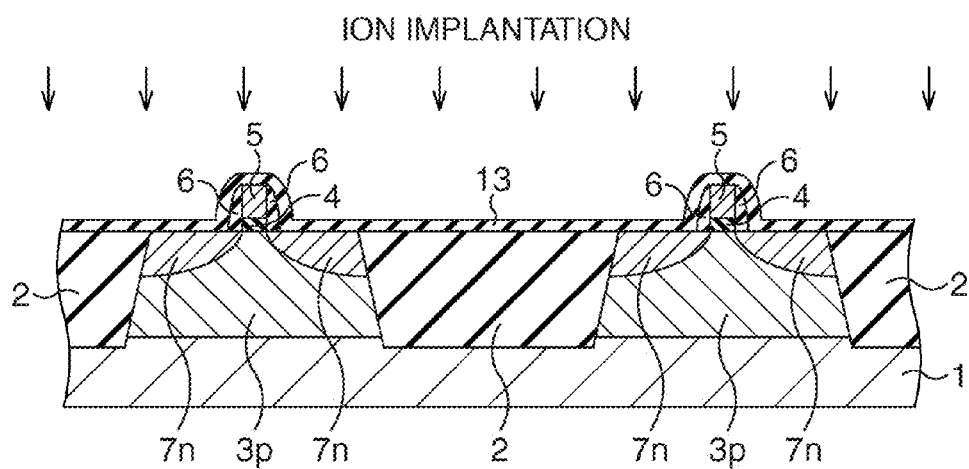
Figure 3D:
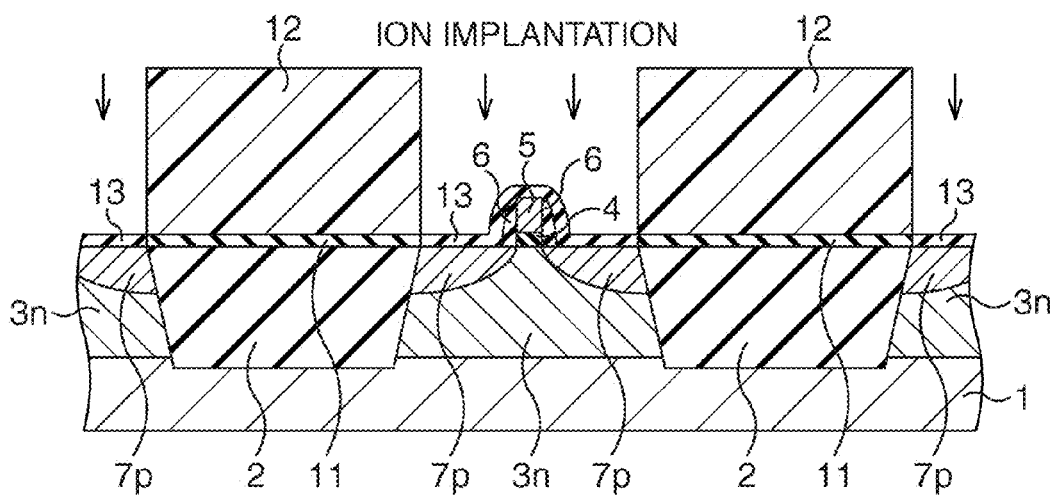

Subsequently, as illustrated in FIG. 2D and FIG. 3D, a resist pattern 12 covering only regions between the pMOS regions is formed on the expanding film 11. Then, a Ge ion is implanted into the expanding film 11 by using the resist pattern 12 as a mask. As a result, in the expanding film 11, a stress facing outwardly is relaxed from portions where the Ge ion is implanted. Thus, the above portions can no longer function as the expanding film 11, and as illustrated also in FIG. 1B, become an insulating film 13.

Figure 2E:
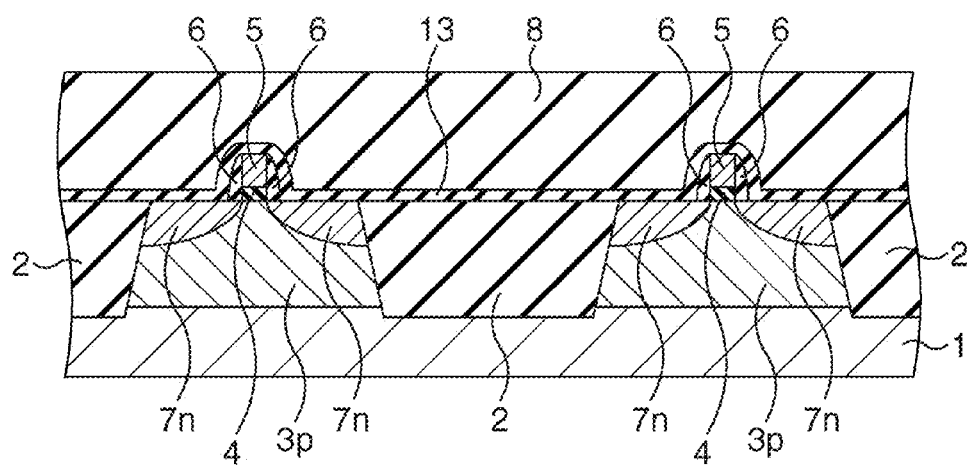
Figure 3E:
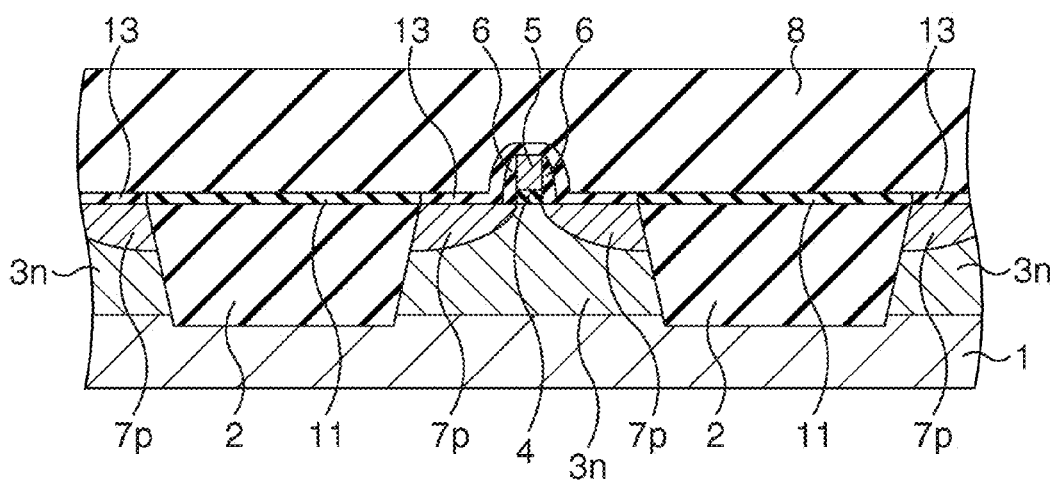

Next, as illustrated in FIG. 2E and FIG. 3E, the resist pattern 12 is removed, and an interlayer insulating film 8 is formed on the expanding film 11 and the insulating film 13.

Thereafter, contact plugs, multilayer wirings, and so on are formed, and the semiconductor device is completed.

In the semiconductor device manufactured in this manner, as illustrated in FIG. 1B, in the second direction, the n-channel MOS transistor and the expanding film 11 are adjacent in a plan view. Therefore, as illustrated by thick arrows in FIG. 1B, the n-channel MOS transistor receives a positive stress in the direction in which a channel length is extended from the expanding film 11. As a result, a positive tensile strain in the electron moving direction is generated in the channel of the n-channel MOS transistor. On the other hand, in the second direction, the p-channel MOS transistor and the expanding film 11 are shifted from each other in a plan view. Therefore, as illustrated by the thick arrows in FIG. 1B, the p-channel MOS transistor receives a positive stress in the direction in which a channel length is narrowed from the expanding film 11. As a result, a positive compressive strain in the hole moving direction is generated in the channel of the p-channel MOS transistor. Thus, according to this embodiment, both on-currents of the n-channel MOS transistor and the p-channel MOS transistor can be improved. Then, this effect becomes prominent as miniaturization proceeds.

Second Embodiment

Figure 4A:
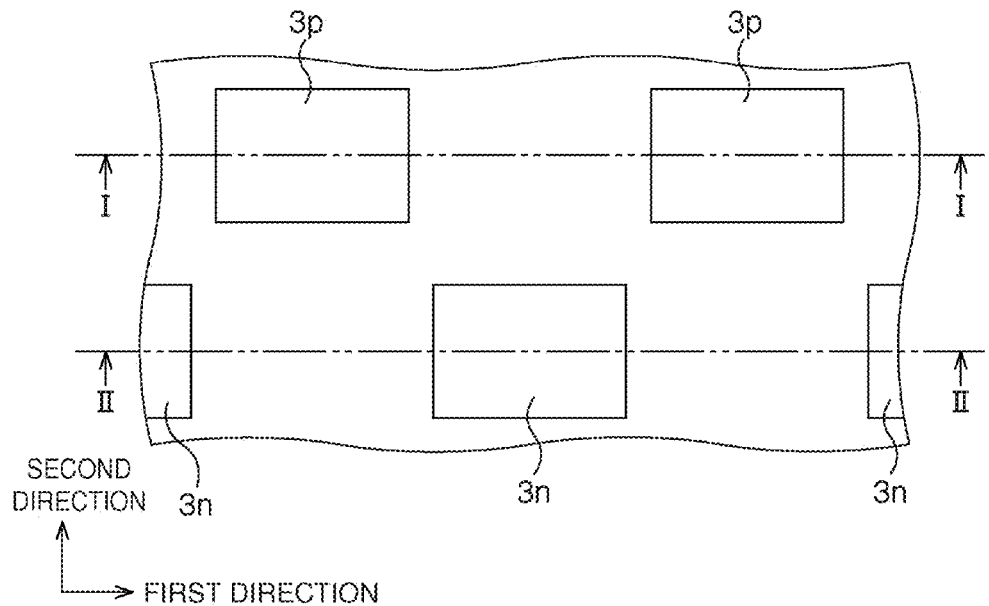
FIG. 4A and FIG. 4B are plan views showing a manufacturing method of a semiconductor device according to a second embodiment in order of steps.
Figure 4B:
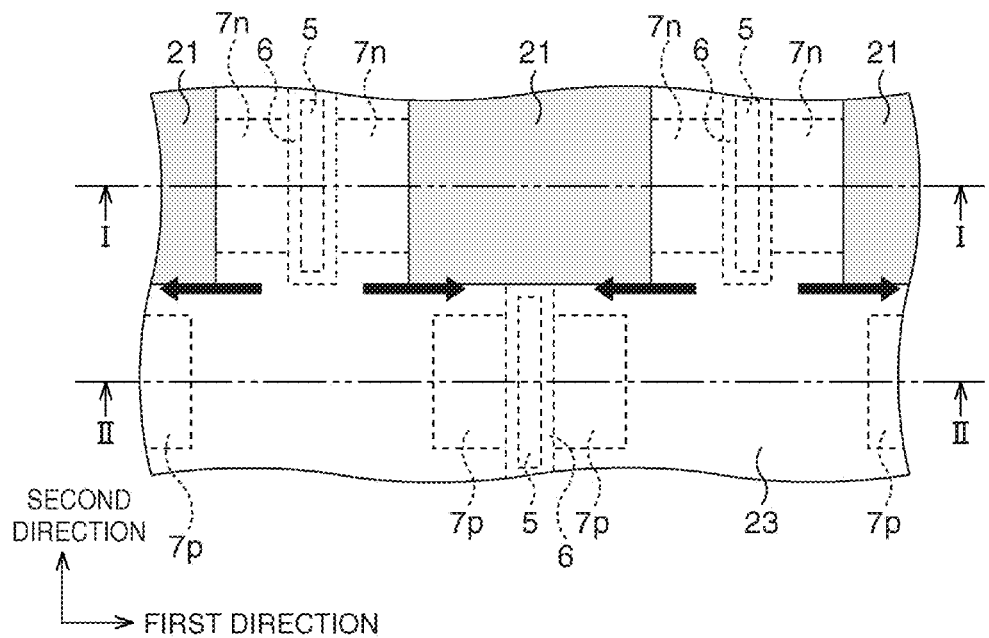

Next, a second embodiment will be explained. In the second embodiment as well, an n-channel MOS transistor and a p-channel MOS transistor having channels extending in parallel to each other are formed on a semiconductor substrate. Further, within a plane parallel to the surface of the semiconductor substrate, a direction in which straight lines connecting sources and drains of these transistors are extended (a channel length direction) is referred as a first direction, and a direction perpendicular to the first direction (a channel width direction) is referred as a second direction. That is, in the n-channel MOS transistor, an electron moving direction in the channel corresponds to the first direction, and in the p-channel MOS transistor, a hole moving direction in the channel corresponds to the first direction. Further, a region where the n-channel MOS transistor is to be formed is referred as an nMOS region, and a region where the p-channel MOS transistor is to be formed is referred as a pMOS region. FIG. 4A and FIG. 4B are plan views showing a manufacturing method of a semiconductor device according to the second embodiment in order of steps. Further, FIG. 5A to FIG. 5E are cross-sectional views showing the manufacturing method of a semiconductor device according to the second embodiment in order of steps, and FIG. 6A to FIG. 6E are also cross-sectional views showing the manufacturing method of a semiconductor device according to the second embodiment in order of steps. Note that FIG. 5A to FIG. 5E show cross sections taken along a line I-I in FIG. 4A and FIG. 4B, and FIG. 6A to FIG. 6E show cross sections taken along a line II-II in FIG. 4A and FIG. 4B.

Figure 5A:
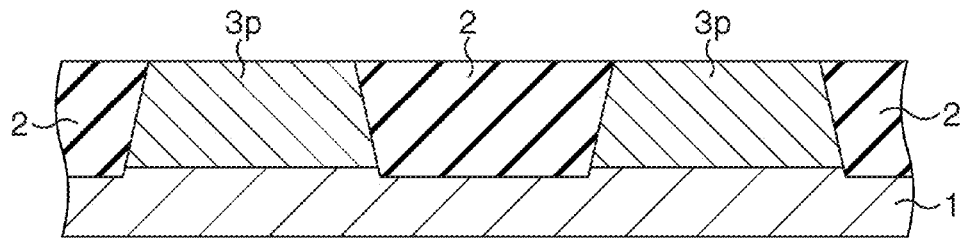
FIG. 5A to FIG. 5E are cross-sectional views showing the manufacturing method of a semiconductor device according to the second embodiment in order of steps.
Figure 6A:
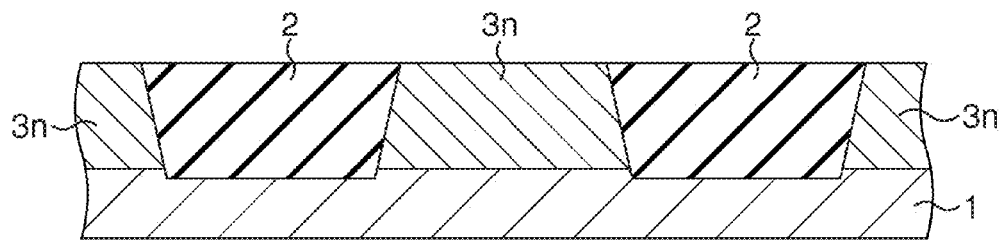
FIG. 6A to FIG. 6E are cross-sectional views showing the manufacturing method of a semiconductor device according to the second embodiment in order of steps.

In the second embodiment, first, as illustrated in FIG. 4A, FIG. 5A and FIG. 6A, an element isolation insulating film 2 is formed on the surface of a semiconductor substrate 1 such as a silicon substrate by, for example, an STI (shallow trench isolation) method. In this moment, the nMOS regions are arranged in a row in the first direction, and the pMOS regions are arranged in a row in the first direction while separating from the row of the nMOS regions. Further, with regard to the second direction as well, the pMOS regions are shifted from the nMOS regions. Next, by introducing an impurity, a p-well 3p is formed in the nMOS region, and an n-well 3n is formed in the pMOS region.

Figure 5B:
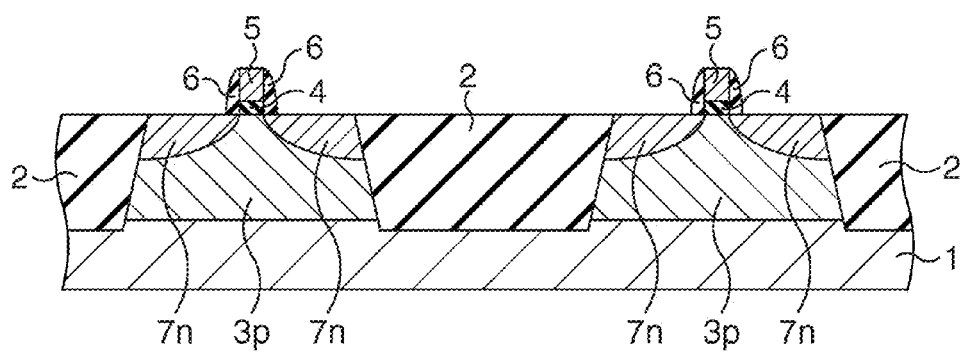
Figure 6B:
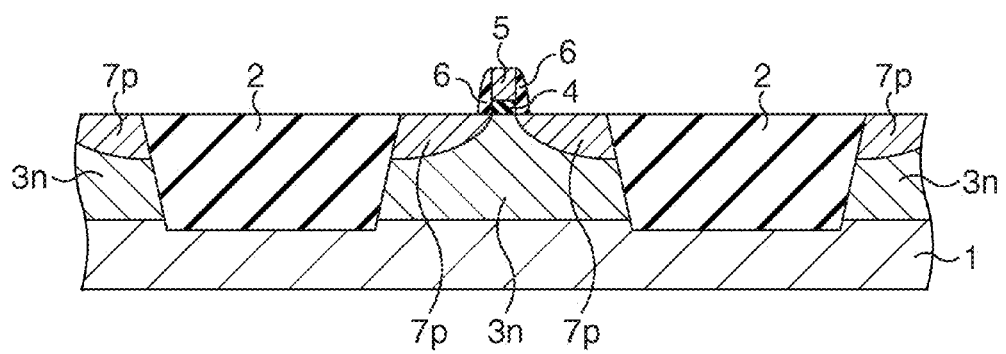

Next, as illustrated in FIG. 5B and FIG. 6B, gate insulating films 4, gate electrodes 5, sidewall insulating films 6, and impurity diffusion layers are formed in the nMOS region and the pMOS region. In the nMOS region, as illustrated in FIG. 5B, n-type impurity diffusion layers 7n are formed as the impurity diffusion layers, and in the pMOS region, as illustrated in FIG. 6B, p-type impurity diffusion layers 7p are formed as the impurity diffusion layers.

Figure 5C:
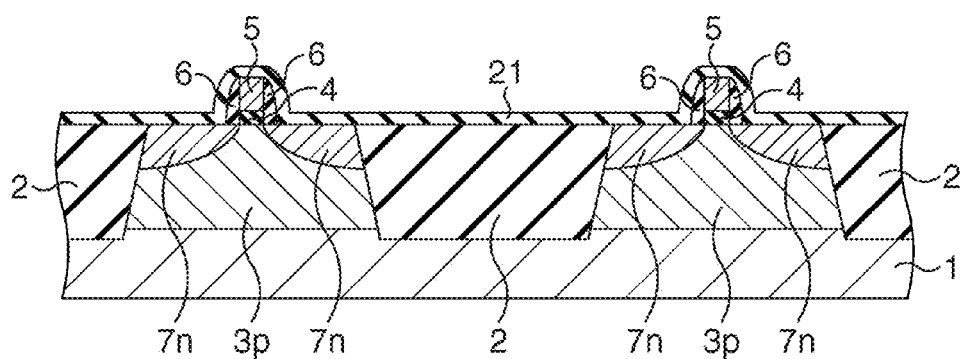
Figure 6C:
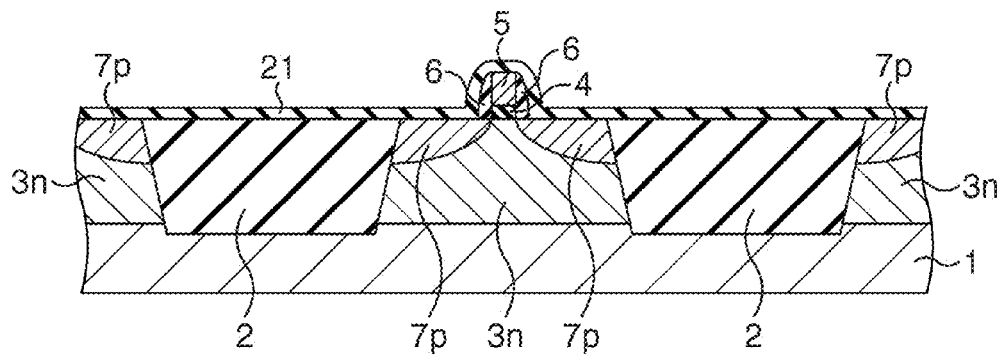

Thereafter, as illustrated in FIG. 5C and FIG. 6C, an insulative contracting film 21 exerting a positive stress facing inwardly on a periphery is formed on the entire surface as a stress applying film. As the contracting film 21, a silicon nitride film formed by, for example, a plasma CVD (chemical vapor deposition) method can be cited.

Figure 5D:
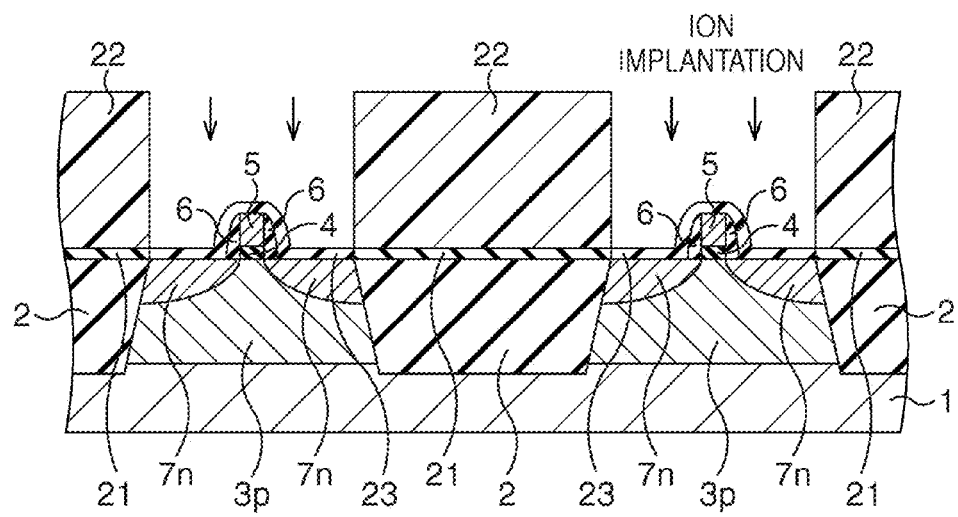
Figure 6D:
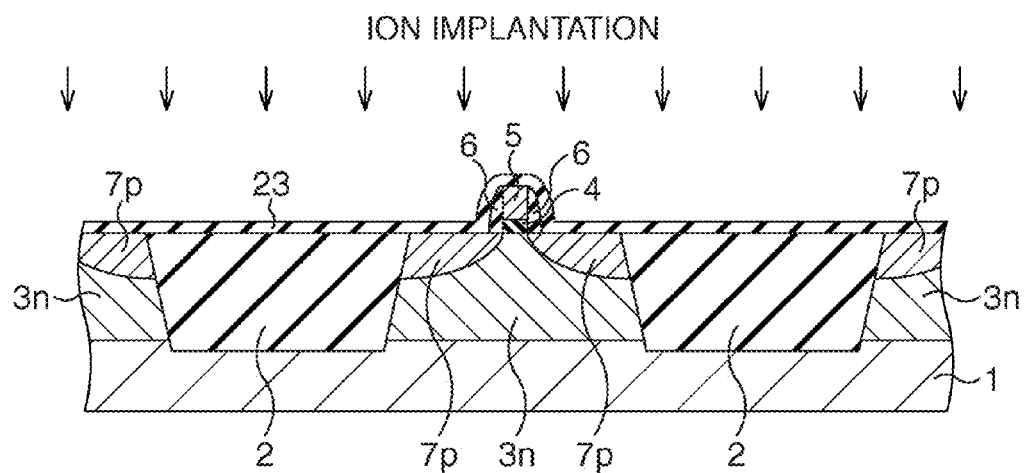

Subsequently, as illustrated in FIG. 5D and FIG. 6D, a resist pattern 22 covering only regions between the nMOS regions is formed on the contracting film 21. Then, a Ge ion is implanted into the contracting film 21 by using the resist pattern 22 as a mask. As a result, in the contracting film 21, a stress facing inwardly is relaxed from portions where the Ge ion is implanted. Thus, the above portions can no longer function as the contracting film 21, and as illustrated also in FIG. 4B, become an insulating film 23.

Figure 5E:
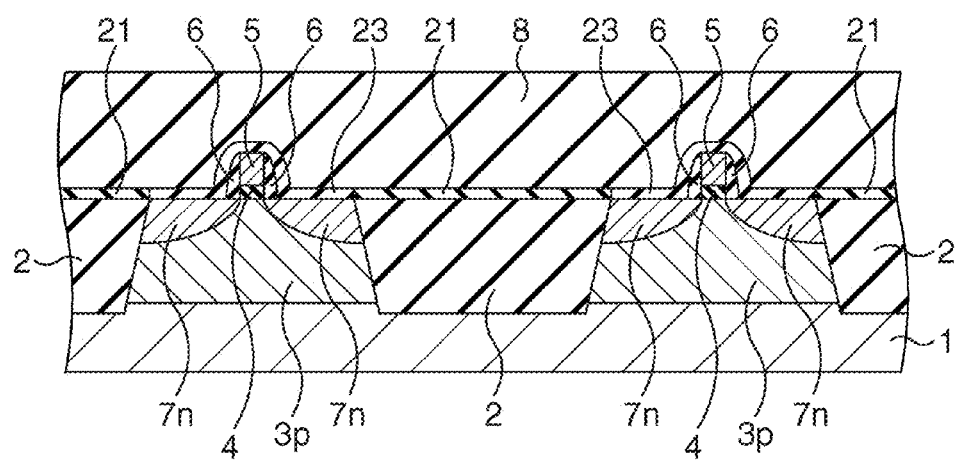
Figure 6E:
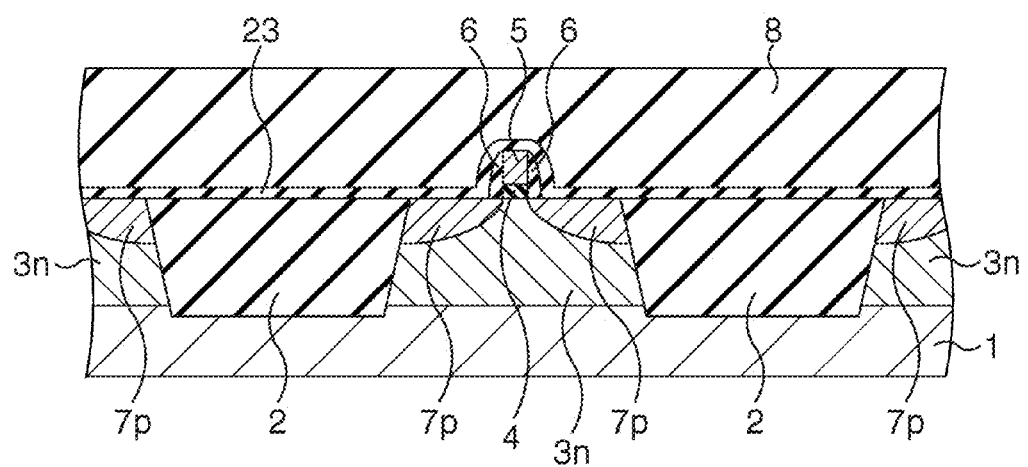

Next, as illustrated in FIG. 5E and FIG. 6E, the resist pattern 22 is removed, and an interlayer insulating film 8 is formed on the contracting film 21 and the insulating film 23.

Thereafter, contact plugs, multilayer wirings, and so on are formed, and the semiconductor device is completed.

In the semiconductor device manufactured in this manner, as illustrated in FIG. 4B, in the second direction, the p-channel MOS transistor and the contracting film 21 are adjacent in a plan view. Therefore, as illustrated by thick arrows in FIG. 4B, the p-channel MOS transistor receives a positive stress in the direction in which a channel length is narrowed from the contracting film 21. As a result, a positive compressive strain in the hole moving direction is generated in the channel of the p-channel MOS transistor. On the other hand, in the second direction, the n-channel MOS transistor and the contracting film 21 are shifted from each other in a plan view. Therefore, as illustrated by the thick arrows in FIG. 4B, the n-channel MOS transistor receives a positive stress in the direction in which a channel length is extended from the contracting film 21. As a result, a positive tensile strain in the electron moving direction is generated in the channel of the n-channel MOS transistor. Thus, according to this embodiment as well, both on-currents of the n-channel MOS transistor and the p-channel MOS transistor can be improved. Then, this effect becomes prominent as miniaturization proceeds.

Note that in the first and second embodiments, the stress is relaxed selectively by implanting the Ge ion into the stress applying film, but the stress may be relaxed selectively by irradiating an electron beam.

Third Embodiment

Figure 7A:
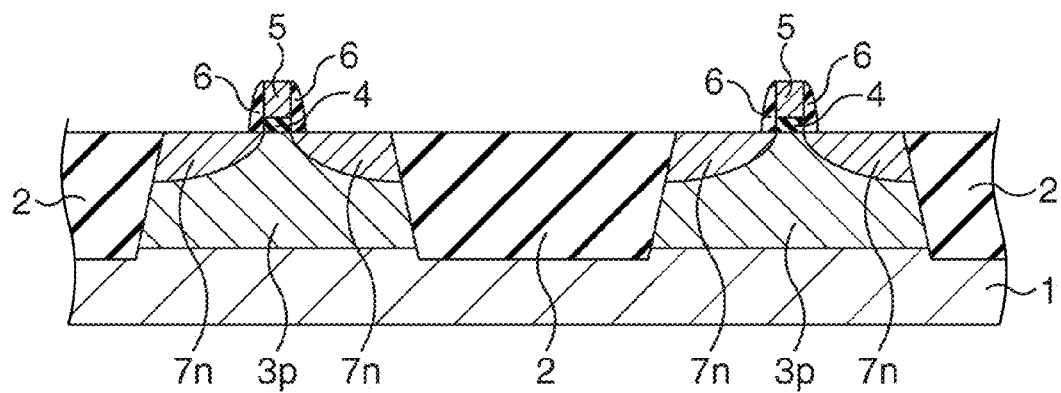
FIG. 7A and FIG. 7B are cross-sectional views showing a manufacturing method of a semiconductor device according to a third embodiment in order of steps.
Figure 7B:
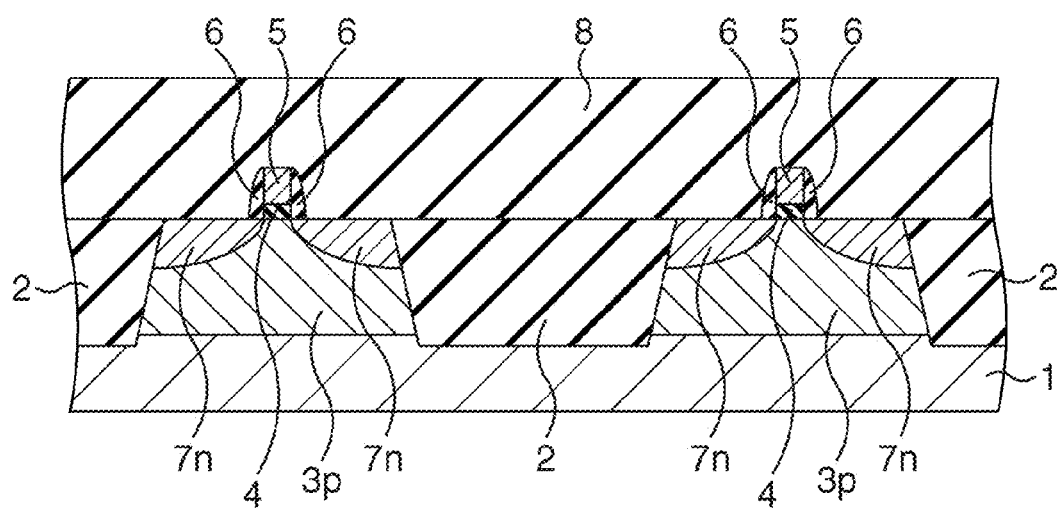
Figure 8A:
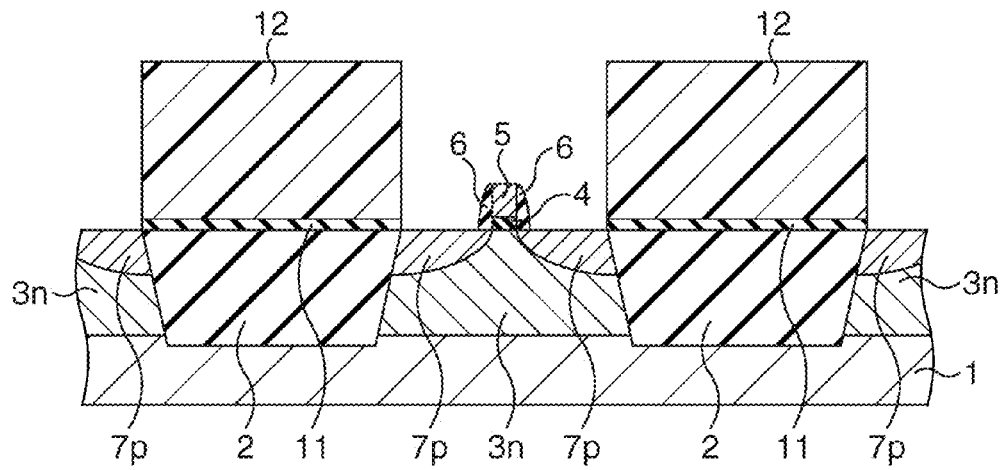
FIG. 8A and FIG. 8B are cross-sectional views showing the manufacturing method of a semiconductor device according to the third embodiment in order of steps.
Figure 8B:
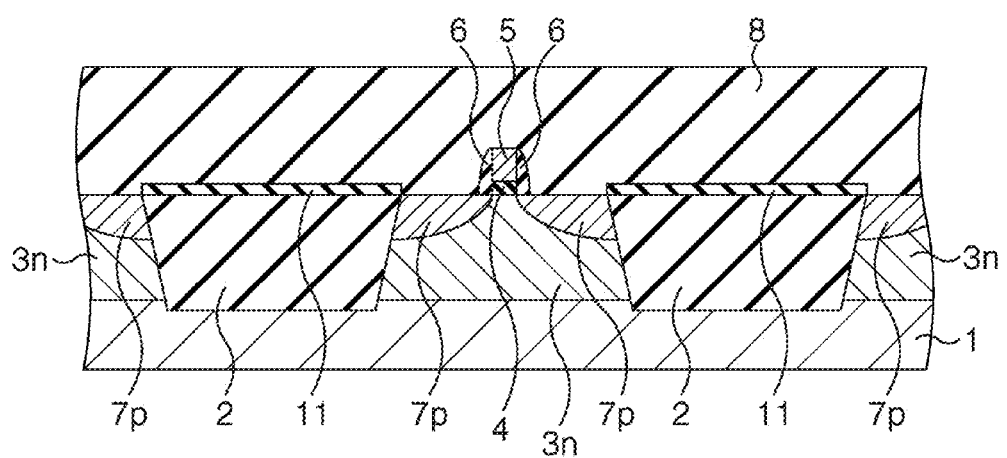

Next, a third embodiment will be explained. Here, points different from the first embodiment will be mainly explained. FIG. 7A and FIG. 7B are cross-sectional views showing a manufacturing method of a semiconductor device according to the third embodiment in order of steps, and FIG. 8A and FIG. 8B are also cross-sectional views showing the manufacturing method of a semiconductor device according to the third embodiment in order of steps. Note that FIG. 7A and FIG. 7B show cross sections taken along the line I-I in FIG. 1A, and FIG. 8A and FIG. 8B show cross sections taken along the line II-II in FIG. 1A.

In the third embodiment, first, similarly to the first embodiment, processes to formation of an expanding film 11 are performed (refer to FIG. 2C and FIG. 3C). Next, as illustrated in FIG. 7A and FIG. 8A, a resist pattern 12 covering only regions between pMOS regions is formed on the expanding film 11. Then, etching of the expanding film 11 is performed by using the resist pattern 12 as a mask. As a result, portions exposed from the resist pattern 12 disappear from the expanding film 11.

Next, as illustrated in FIG. 7B and FIG. 8B, the resist pattern 12 is removed, and an interlayer insulating film 8 is formed on the entire surface.

Thereafter, contact plugs, multilayer wirings, and so on are formed, and the semiconductor device is completed.

In the semiconductor device manufactured in this manner, an insulating film 13, which exists in the first embodiment, does not exist. The structure except the above is the same as that of the first embodiment. That is, the function of the expanding film 11 is the same as that of the first embodiment. Thus, according to the third embodiment as well, the same effect as that of the first embodiment can be obtained.

Fourth Embodiment

Figure 9A:
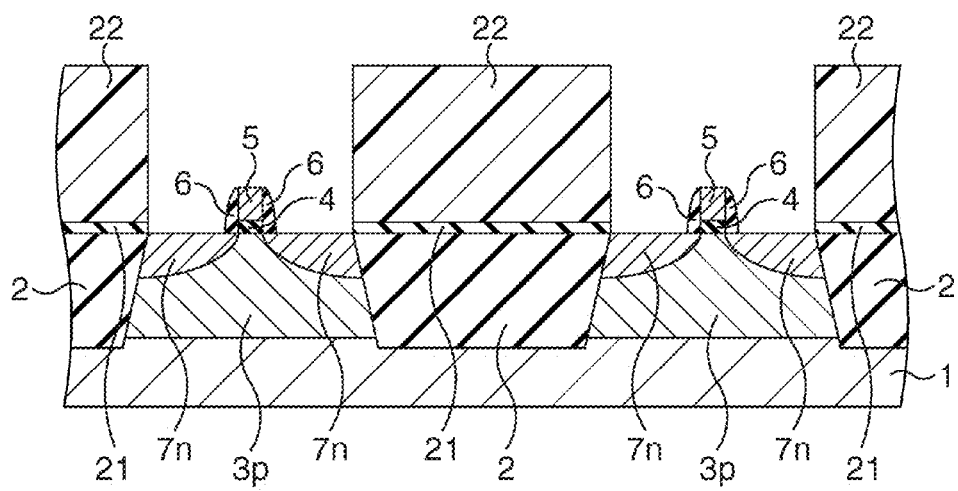
FIG. 9A and FIG. 9B are cross-sectional views showing a manufacturing method of a semiconductor device according to a fourth embodiment in order of steps.
Figure 9B:
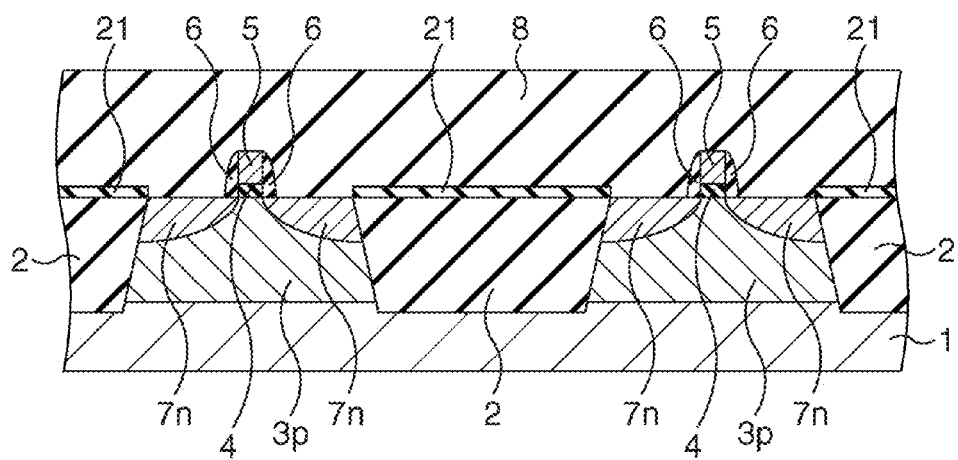
Figure 10A:
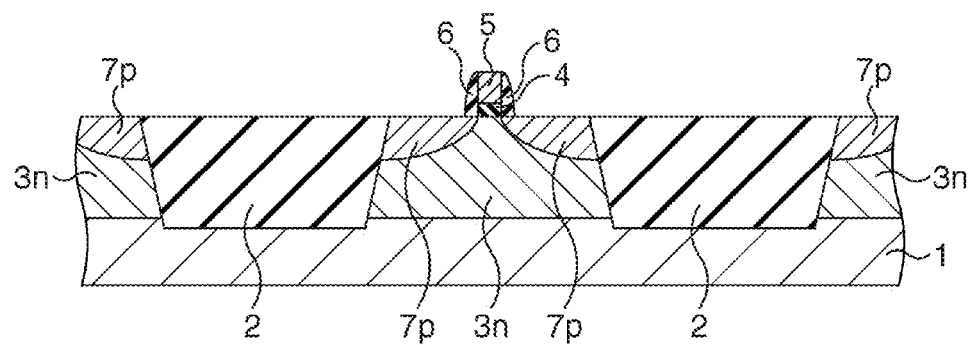
FIG. 10A and FIG. 10B are cross-sectional views showing the manufacturing method of a semiconductor device according to the fourth embodiment in order of steps.
Figure 10B:
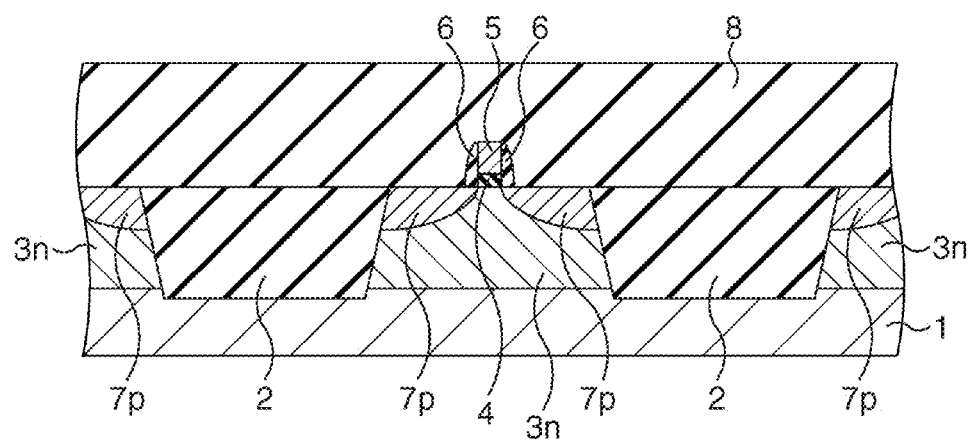

Next, a fourth embodiment will be explained. Here, points different from the second embodiment will be mainly explained. FIG. 9A and FIG. 9B are cross-sectional views showing a manufacturing method of a semiconductor device according to the fourth embodiment in order of steps, and FIG. 10A and FIG. 10B are also cross-sectional views showing the manufacturing method of a semiconductor device according to the fourth embodiment in order of steps. Note that FIG. 9A and FIG. 9B show cross sections taken along the line I-I in FIG. 4A, and FIG. 10A and FIG. 10B show cross sections taken along the line II-II in FIG. 4A.

In the fourth embodiment, first, similarly to the second embodiment, processes to formation of a contracting film 21 are performed (refer to FIG. 5C and FIG. 6C). Next, as illustrated in FIG. 9A and FIG. 10A, a resist pattern 22 covering only regions between nMOS regions is formed on the contracting film 21. Then, etching of the contracting film 21 is performed by using the resist pattern 22 as a mask. As a result, portions exposed from the resist pattern 22 disappear from the contracting film 21.

Next, as illustrated in FIG. 9B and FIG. 10B, the resist pattern 22 is removed, and an interlayer insulating film 8 is formed on the entire surface.

Thereafter, contact plugs, multilayer wirings, and so on are formed, and the semiconductor device is completed.

In the semiconductor device manufactured in this manner, an insulating film 23, which exists in the second embodiment, does not exist. The structure except the above is the same as that of the second embodiment. That is, the function of the contracting film 21 is the same as that of the second embodiment. Thus, according to the fourth embodiment as well, the same effect as that of the second embodiment can be obtained.

Figure 11:
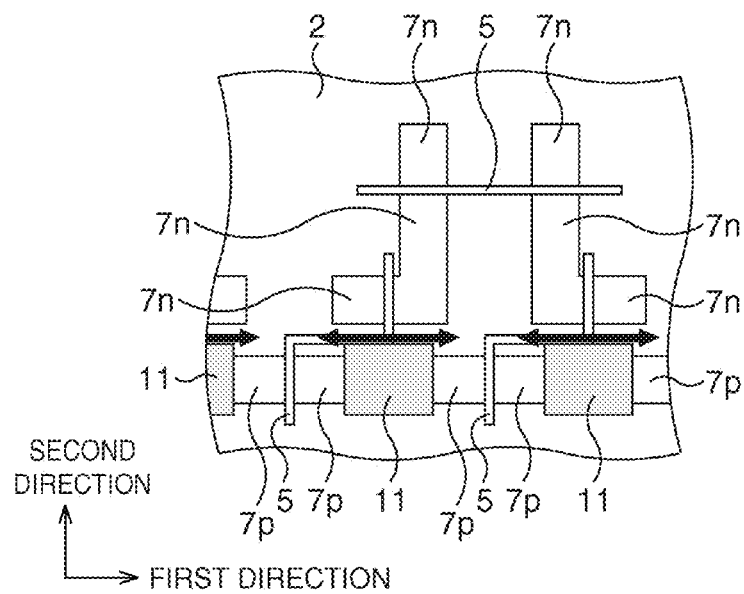
FIG. 11 is a schematic view showing a layout of an SRAM cell to which the third embodiment is applied.
Figure 18:
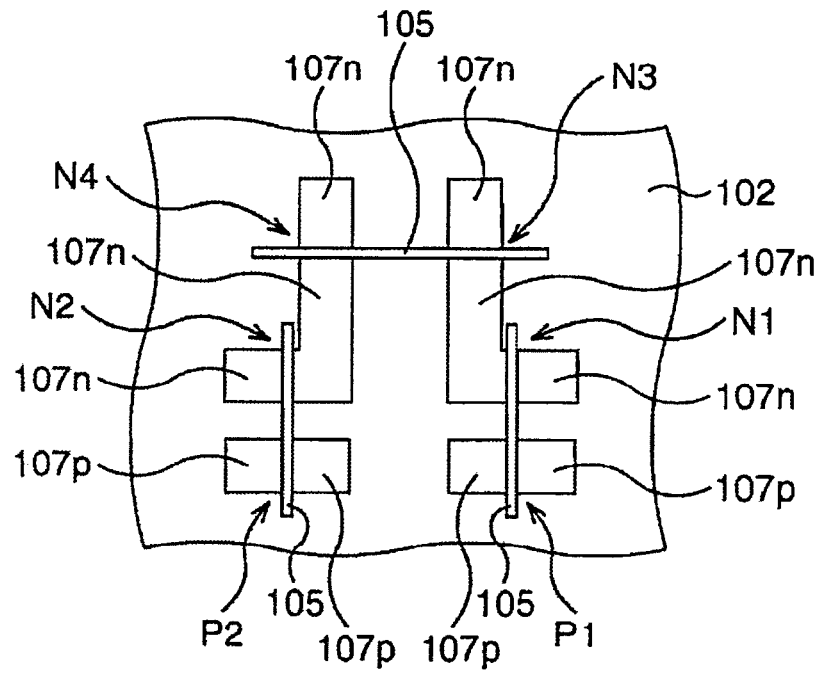
FIG. 18 is a schematic view showing a layout of a conventional SRAM cell.
Figure 19:
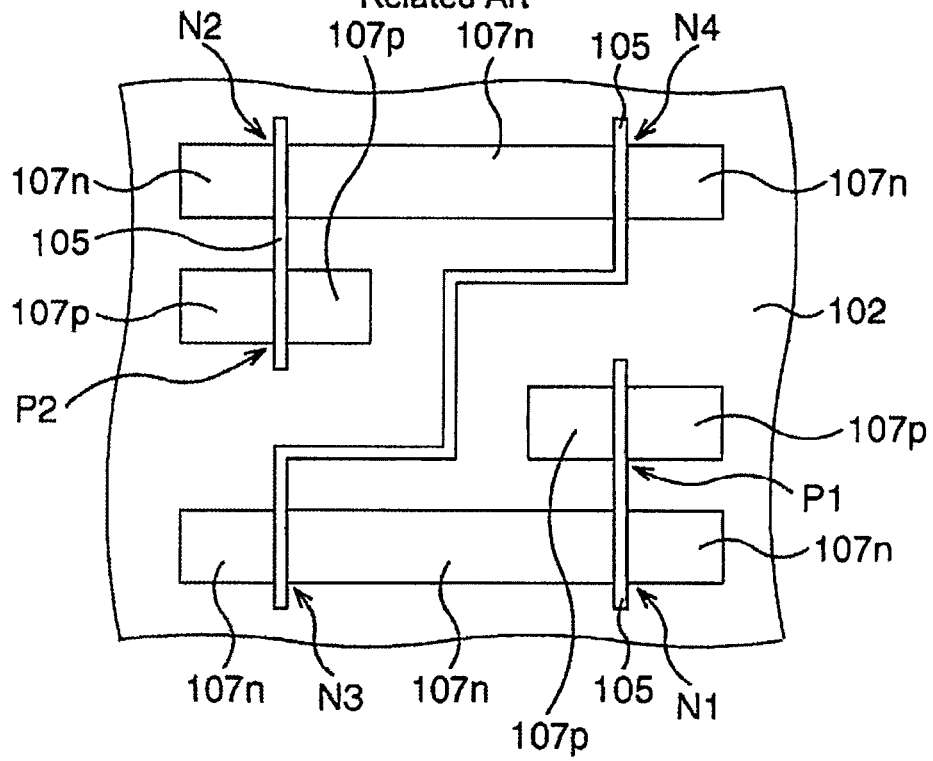
FIG. 19 is a schematic view showing another layout of the conventional SRAM cell.

Note that the third embodiment can be applied to an SRAM cell when a layout illustrated in FIG. 11 is adopted. That is, with regard to the second direction, positions of the n-channel MOS transistor and the p-channel MOS transistor constituting a CMOS transistor are shifted from each other, and the expanding film 11 is positioned between the p-channel MOS transistors, and thereby, an on-current of the CMOS transistor can be improved. Further in this layout, an area hardly increases even when the layout is compared with a layout illustrated in FIG. 18. Note that the first, the second, or the fourth embodiment can also be applied to the same layout.

Figure 12:
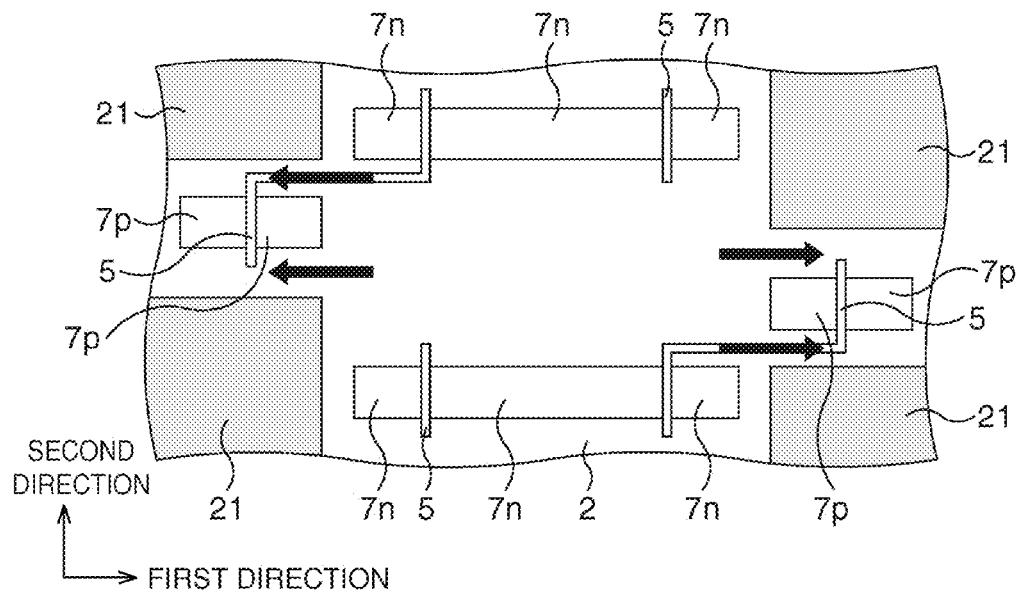
FIG. 12 is a schematic view showing a layout of an SRAM cell to which the fourth embodiment is applied.

Further, the fourth embodiment can be applied to an SRAM cell when a layout illustrated in FIG. 12 is adopted. That is, with regard to the second direction, positions of the n-channel MOS transistor and the p-channel MOS transistor constituting a CMOS transistor are shifted from each other, and the contracting film 21 is positioned between the p-channel MOS transistors, and thereby, an on-current of the CMOS transistor can be improved. Note that the first to the third embodiments can also be applied to the same layout.

Here, various simulations that the present inventor conducted will be explained.

Figure 13:
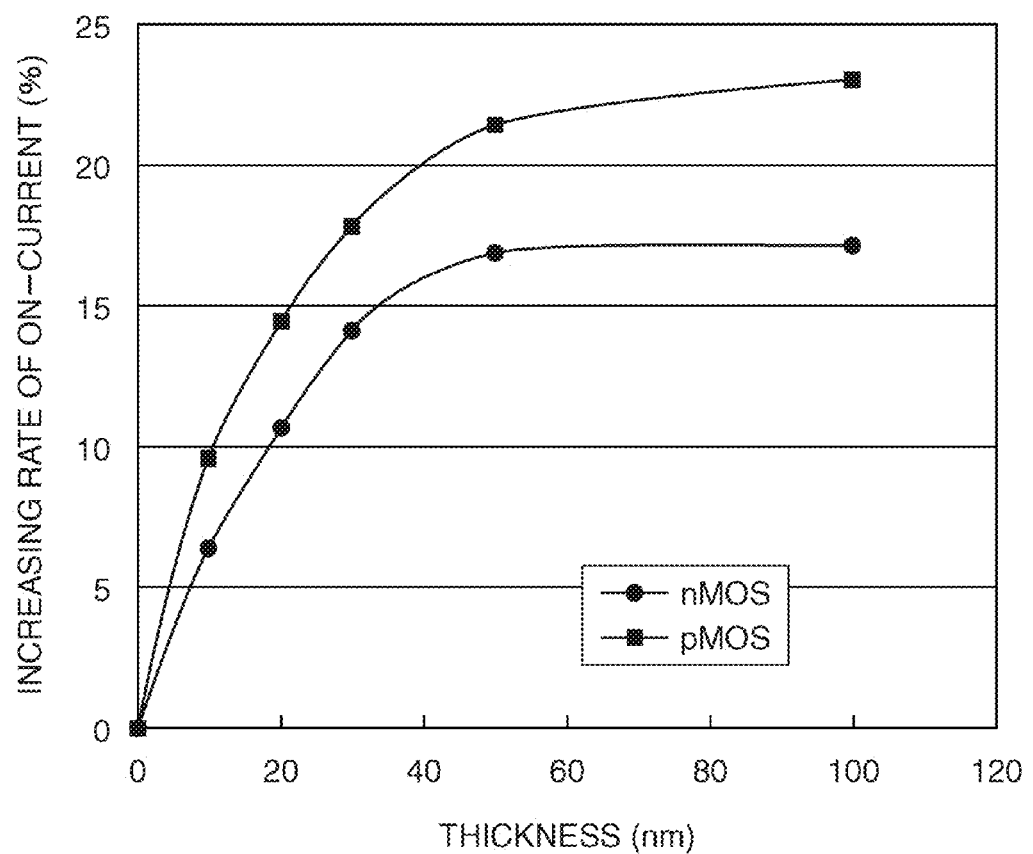
FIG. 13 is a graph showing a result of a first simulation.

In a first simulation, with regard to the third embodiment, a relation between a thickness of the expanding film 11 and an increasing rate of an on-current was calculated. A result thereof is illustrated in FIG. 13. Note that the increasing rate of an on-current is a value based on the on-current in the case of not providing the expanding film 11. It can be said from FIG. 13 that the thicker expanding film 11 the semiconductor device has, the higher the increasing rate of an on-current becomes.

Figure 14:
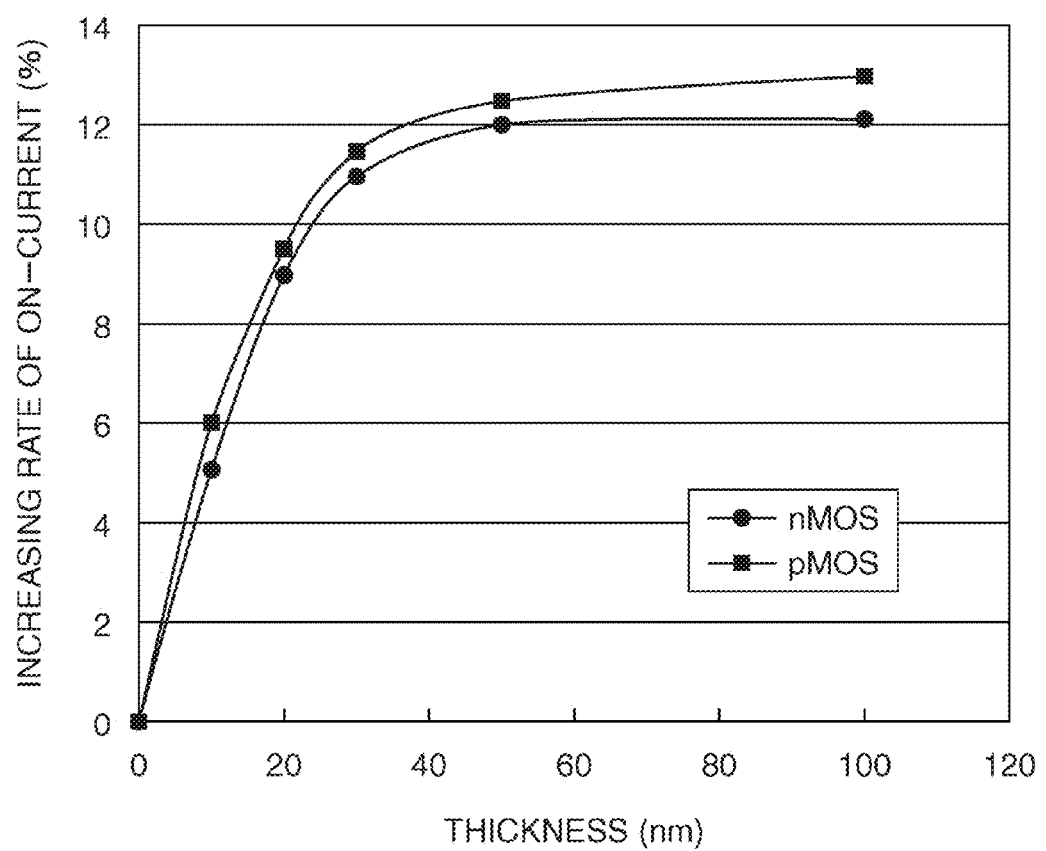
FIG. 14 is a graph showing a result of a second simulation.

In a second simulation, with regard to the fourth embodiment, a relation between a thickness of the contracting film 21 and an increasing rate of an on-current was calculated. A result thereof is illustrated in FIG. 14. Note that the increasing rate of an on-current is a value based on the on-current in the case of not providing the contracting film 21. It can be said from FIG. 14 that the thicker contracting film 21 the semiconductor device has, the higher the increasing rate of an on-current becomes.

Figure 15:
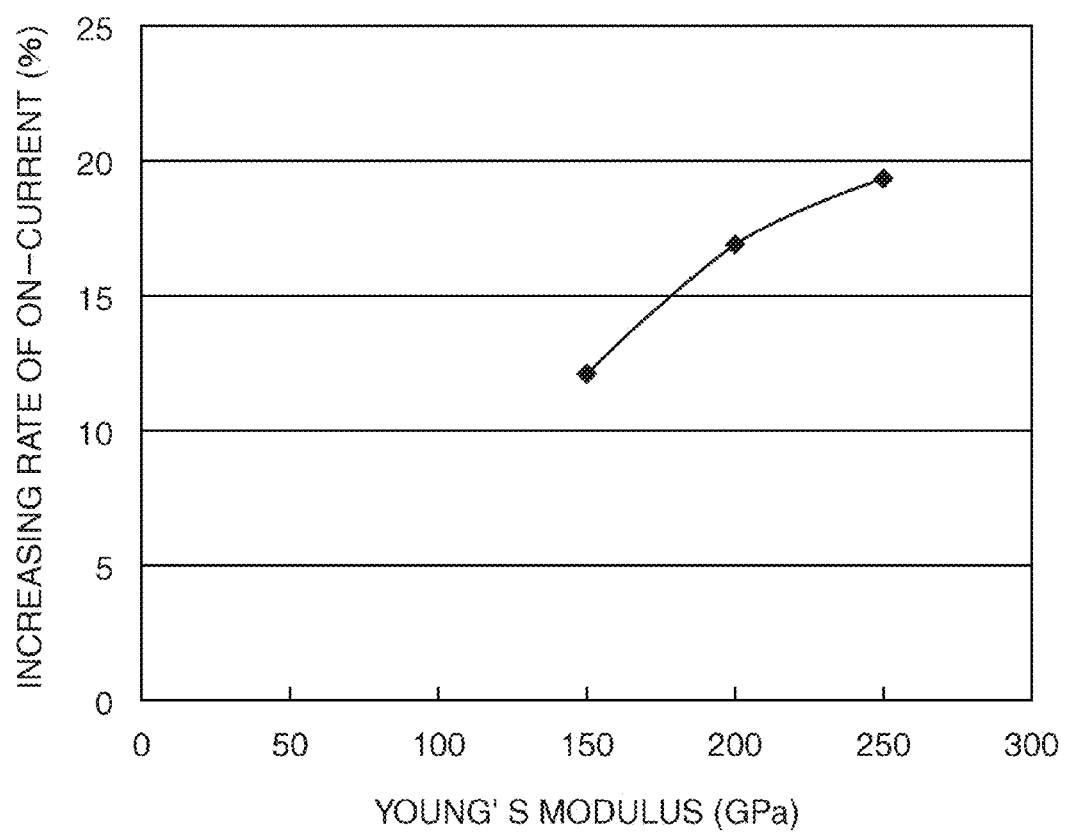
FIG. 15 is a graph showing a result of a third simulation.

In a third simulation, with regard to the third embodiment, a relation between a Young's modulus of the expanding film 11 and an increasing rate of an on-current of the n-channel MOS transistor was calculated. A result thereof is illustrated in FIG. 15. Note that the increasing rate of the on-current is a value based on the on-current in the case of not providing the expanding film 11. It can be said from FIG. 15 that the higher Young's modulus of the expanding film 11 the semiconductor device has, the higher the increasing rate of the on-current becomes.

Figure 16:
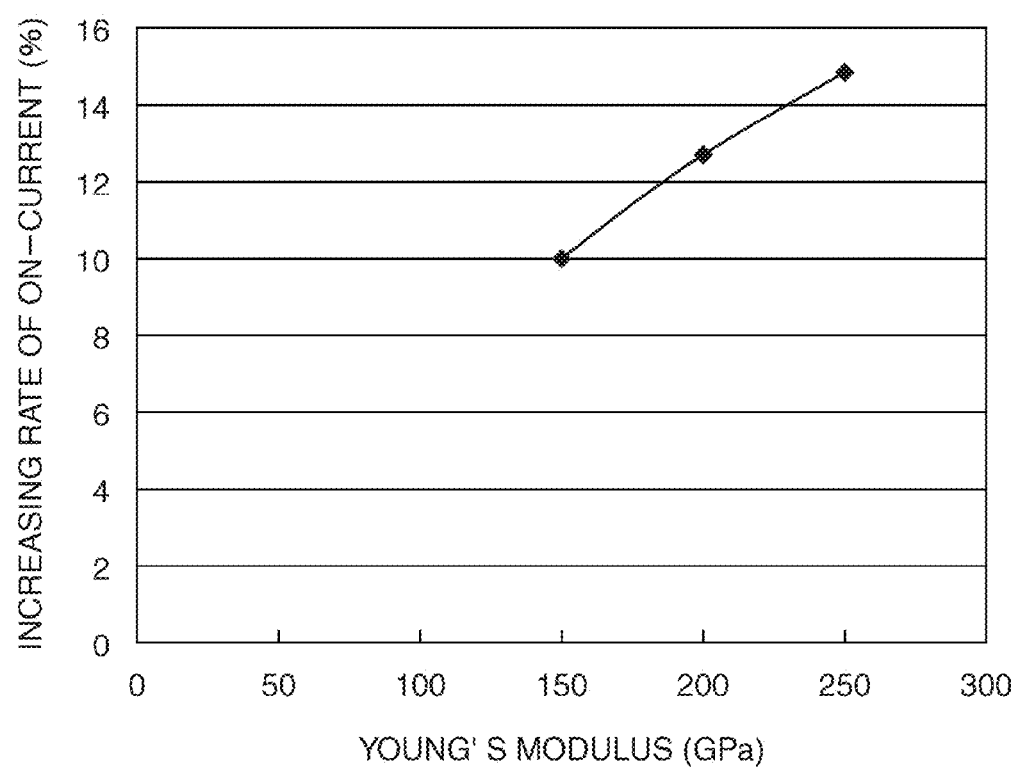
FIG. 16 is a graph showing a result of a fourth simulation.
Figure 17:
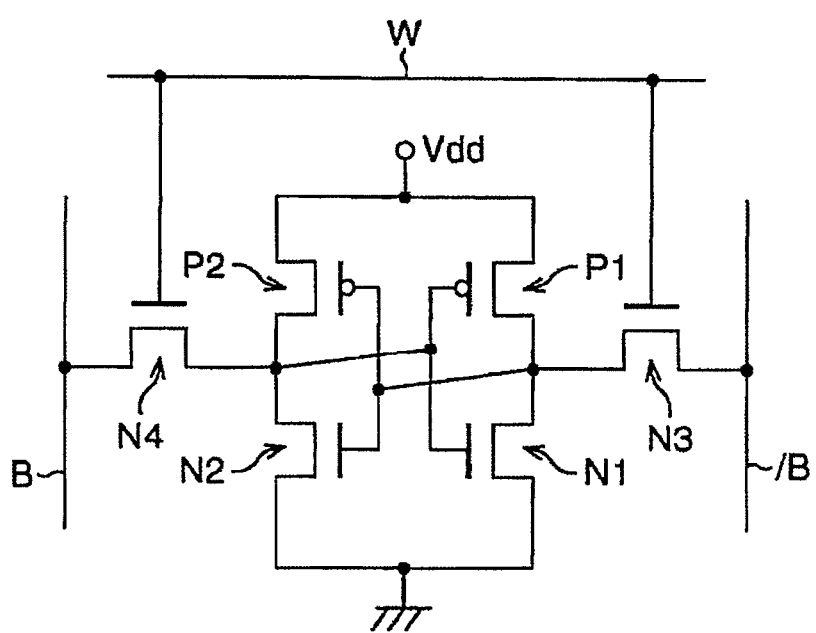
FIG. 17 is a circuit diagram showing a constitution of an SRAM cell.

In a fourth simulation, with regard to the fourth embodiment, a relation between a Young's modulus of the contracting film 21 and an increasing rate of an on-current of the p-channel MOS transistor was calculated. A result thereof is illustrated in FIG. 16. Note that the increasing rate of the on-current is a value based on the on-current in the case of not providing the contracting film 21. It can be said from FIG. 16 that the higher Young's modulus of the contracting film 21 the semiconductor device has, the higher the increasing rate of the on-current becomes.

Note that positions in thickness directions of the expanding film and the contracting film are not particularly limited, and the expanding film and the contracting film may exist inside, for example, the element isolation insulating film. In this case, for example, before forming the n-channel MOS transistor and the p-channel MOS transistor, a part of the element isolation insulating film may be removed, and the expanding film or the contracting film may be embedded therein.

Further, the expanding film and the contracting film may be used together. Further, a tensile stress may be generated in the channel of the n-channel MOS transistor by forming a SiC layer in the source and the drain of the n-channel MOS transistor by, for example, an epitaxial growth method. Further, a compressive stress may be generated in the channel of the p-channel MOS transistor by forming a SiGe layer in the source and the drain of the p-channel MOS transistor by, for example, an epitaxial growth method.

According to the embodiments, both on-currents of an n-channel MOS transistor and a p-channel MOS transistor can be improved by only a stress applying film. Thus, a constitution is simple, and easy manufacturing becomes possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A manufacturing method of a semiconductor device comprising:

forming an n-channel metal-oxide-semiconductor transistor in a first region on a surface of a semiconductor substrate and a p-channel metal-oxide-semiconductor transistor in a second region on the surface of the semiconductor substrate;

forming a contracting film in the first region, in the second region, and in a third region and a fourth region on the surface of the semiconductor substrate; and performing an ion implantation into the contracting film to relax a stress of the contracting film in the first region, the second region, and the fourth region, and leave a stress of the contracting film in the third region, wherein the first region is in contact with the third region in a first direction, the second region is in contact with the third region in a second direction perpendicular to the first direction, the fourth region is in contact with the first region in the second direction and is in contact with the second region in the first direction, a channel width direction of the n-channel metal-oxide-semiconductor transistor is parallel to the second direction, a channel width direction of the p-channel metal-oxide-semiconductor transistor is parallel to the second direction, and the first direction and the second direction are perpendicular to a normal line to the surface of the semiconductor substrate.

2. The manufacturing method of a semiconductor device according to claim 1, wherein, as the contracting film, a silicon nitride film is formed by a plasma chemical-vapor-deposition method.

3. A manufacturing method of a semiconductor device comprising:

forming an element isolation insulating film on a surface of a semiconductor substrate; and forming an n-channel metal-oxide-semiconductor transistor in a first region on the surface of the semiconductor substrate and a p-channel metal-oxide-semiconductor transistor in a second region on the surface of the semiconductor substrate, wherein forming the element isolation insulating film comprises:

forming a contracting film in a third region and a fourth region on the surface of the semiconductor substrate; and performing an ion implantation into the contracting film to relax a stress of the contracting film in the fourth region, and leave a stress of the contracting film in the third region, the first region is in contact with the third region in a first direction, the second region is in contact with the third region in a second direction perpendicular to the first direction, the fourth region is in contact with the first region in the second direction and is in contact with the second region in the first direction, a channel width direction of the n-channel metal-oxide-semiconductor transistor is parallel to the second direction, a channel width direction of the p-channel metal-oxide-semiconductor transistor is parallel to the second direction, and the first direction and the second direction are perpendicular to a normal line to the surface of the semiconductor substrate.

4. The manufacturing method of a semiconductor device according to claim 3, wherein, as the contracting film, a silicon nitride film is formed by a plasma chemical-vapor-deposition method.

* * * * *